United States Patent
Yang et al.

(10) Patent No.: US 11,450,513 B2
(45) Date of Patent: Sep. 20, 2022

(54) ATOMIC LAYER ETCHING AND SMOOTHING OF REFRACTORY METALS AND OTHER HIGH SURFACE BINDING ENERGY MATERIALS

(71) Applicant: Lam Research Corporation, Fremont, CA (US)

(72) Inventors: Wenbing Yang, Fremont, CA (US); Tamal Mukherjee, Fremont, CA (US); Mohand Brouri, Brussels (BE); Samantha Tan, Fremont, CA (US); Yang Pan, Los Altos, CA (US); Keren Jacobs Kanarik, Los Altos, CA (US)

(73) Assignee: Lam Research Corporation, Fremont, CA (US)

( * ) Notice: Subject to any disclaimer, the term of this patent is extended or adjusted under 35 U.S.C. 154(b) by 0 days.

(21) Appl. No.: 16/976,737

(22) PCT Filed: Mar. 15, 2019

(86) PCT No.: PCT/US2019/022520
§ 371 (c)(1),
(2) Date: Aug. 28, 2020

(87) PCT Pub. No.: WO2019/190781
PCT Pub. Date: Oct. 3, 2019

(65) Prior Publication Data
US 2021/0005425 A1    Jan. 7, 2021

Related U.S. Application Data

(60) Provisional application No. 62/650,469, filed on Mar. 30, 2018.

(51) Int. Cl.
*H01L 21/321*    (2006.01)
*H01J 37/32*    (2006.01)
*H01L 21/3213*    (2006.01)

(52) U.S. Cl.
CPC .... *H01J 37/3244* (2013.01); *H01J 37/32715* (2013.01); *H01J 2237/3341* (2013.01); *H01L 21/32136* (2013.01)

(58) Field of Classification Search
None
See application file for complete search history.

(56) References Cited

U.S. PATENT DOCUMENTS

| | | | |
|---|---|---|---|
| 3,798,056 | A | 3/1974 | Okinaka et al. |
| 4,592,801 | A | 6/1986 | Hara et al. |

(Continued)

FOREIGN PATENT DOCUMENTS

| | | |
|---|---|---|
| CN | 1455950 A | 11/2003 |
| CN | 1550575 A | 12/2004 |

(Continued)

OTHER PUBLICATIONS

U.S. Office Action dated May 5, 2016 issued in U.S. Appl. No. 14/749,285.

(Continued)

*Primary Examiner* — Shamim Ahmed
(74) *Attorney, Agent, or Firm* — Weaver Austin Villeneuve & Sampson LLP

(57) ABSTRACT

Etching a refractory metal or other high surface binding energy material on a substrate can maintain or increase the smoothness of the metal/high EO surface, in some cases produce extreme smoothing. A substrate having an exposed refractory metal/high EO surface is provided. The refractory metal/high EO surface is exposed to a modification gas to modify the surface and form a modified refractory metal/high EO surface. The modified refractory metal/high EO surface is exposed to an energetic particle to preferentially remove the modified refractory metal/high EO surface relative to an underlying unmodified refractory metal/high EO (Continued)

surface such that the exposed refractory metal/high EO surface after removing the modified refractory metal/high EO surface is as smooth or smoother than the substrate surface before exposing the substrate surface to the modification gas.

7 Claims, 8 Drawing Sheets

(56) References Cited

U.S. PATENT DOCUMENTS

| | | | |
|---|---|---|---|
| 4,756,794 | A | 7/1988 | Yoder |
| 5,411,631 | A | 5/1995 | Hori et al. |
| 6,022,806 | A | 2/2000 | Sato et al. |
| 6,083,413 | A | 7/2000 | Sawub et al. |
| 6,143,082 | A | 11/2000 | McInerney et al. |
| 6,177,353 | B1 | 1/2001 | Gutsche et al. |
| 6,255,731 | B1 | 7/2001 | Ohmi et al. |
| 6,448,192 | B1 | 9/2002 | Kaushik |
| 6,482,745 | B1 | 11/2002 | Hwang |
| 6,635,965 | B1 | 10/2003 | Lee et al. |
| 6,713,122 | B1 | 3/2004 | Mayer et al. |
| 6,841,943 | B2 | 1/2005 | Vahedi et al. |
| 6,844,258 | B1 | 1/2005 | Fair et al. |
| 7,005,372 | B2 | 2/2006 | Levy et al. |
| 7,049,226 | B2 | 5/2006 | Chung et al. |
| 7,115,522 | B2 | 10/2006 | Tomioka et al. |
| 7,141,494 | B2 | 11/2006 | Lee et al. |
| 7,196,955 | B2 | 3/2007 | Nickel |
| 7,416,989 | B1 | 8/2008 | Liu et al. |
| 7,589,017 | B2 | 9/2009 | Chan et al. |
| 7,690,324 | B1 | 4/2010 | Feng et al. |
| 7,772,114 | B2 | 8/2010 | Chan et al. |
| 7,795,148 | B2 | 9/2010 | Brown |
| 7,943,527 | B2 | 5/2011 | Kumar et al. |
| 7,955,972 | B2 | 6/2011 | Chan et al. |
| 8,058,170 | B2 | 11/2011 | Chandrashekar et al. |
| 8,110,503 | B2 | 2/2012 | Kumar et al. |
| 8,124,531 | B2 | 2/2012 | Chandrashekar et al. |
| 8,227,344 | B2 | 7/2012 | Selsley et al. |
| 8,252,194 | B2 | 8/2012 | Kiehlbauch et al. |
| 8,551,885 | B2 | 10/2013 | Chen et al. |
| 8,552,334 | B2 | 10/2013 | Tappan et al. |
| 8,617,411 | B2 | 12/2013 | Singh |
| 8,622,020 | B2 | 1/2014 | Thie et al. |
| 8,728,956 | B2 | 5/2014 | LaVoie |
| 8,808,561 | B2 | 8/2014 | Kanarik |
| 8,883,028 | B2 | 11/2014 | Kanarik |
| 8,993,352 | B2 | 3/2015 | Nishimura et al. |
| 9,048,088 | B2 | 6/2015 | Kolics et al. |
| 9,130,158 | B1 | 9/2015 | Shen et al. |
| 9,240,315 | B1 | 1/2016 | Hsieh et al. |
| 9,257,638 | B2 | 2/2016 | Tan et al. |
| 9,355,839 | B2 | 5/2016 | Swaminathan et al. |
| 9,362,133 | B2 | 6/2016 | Shamma et al. |
| 9,362,163 | B2 | 6/2016 | Danek et al. |
| 9,449,843 | B1 | 9/2016 | Korolik et al. |
| 9,520,821 | B1 | 12/2016 | Sheahan |
| 9,576,811 | B2 | 2/2017 | Kanarik et al. |
| 9,620,376 | B2 | 4/2017 | Kamp et al. |
| 9,647,206 | B2 | 5/2017 | Hashimoto et al. |
| 9,768,033 | B2 | 9/2017 | Ranjan et al. |
| 9,805,941 | B2 | 10/2017 | Kanarik et al. |
| 9,806,252 | B2 | 10/2017 | Tan et al. |
| 9,837,312 | B1 | 12/2017 | Tan et al. |
| 9,870,899 | B2 | 1/2018 | Yang et al. |
| 9,972,504 | B2 | 5/2018 | Yang et al. |
| 9,984,858 | B2 | 5/2018 | Kanarik et al. |
| 9,991,128 | B2 | 6/2018 | Tan et al. |
| 9,997,371 | B1 | 6/2018 | Agarwal et al. |
| 10,056,264 | B2 | 8/2018 | Yang et al. |
| 10,056,268 | B2 | 8/2018 | Li |
| 10,096,487 | B2 | 10/2018 | Yang et al. |
| 10,186,426 | B2 | 1/2019 | Tan et al. |
| 10,269,566 | B2 | 4/2019 | Tan et al. |
| 10,304,659 | B2 | 5/2019 | Kanarik et al. |
| 10,374,144 | B2 | 8/2019 | Tan et al. |
| 10,494,715 | B2 | 12/2019 | Agarwal et al. |
| 10,515,816 | B2 | 12/2019 | Kanarik et al. |
| 10,566,212 | B2 | 2/2020 | Kanarik |
| 10,566,213 | B2 | 2/2020 | Kanarik et al. |
| 10,685,836 | B2 | 6/2020 | Tan et al. |
| 10,727,073 | B2 | 7/2020 | Tan et al. |
| 10,749,103 | B2 | 8/2020 | Tan et al. |
| 10,763,083 | B2 | 9/2020 | Yang et al. |
| 10,784,086 | B2 | 9/2020 | Yang et al. |
| 11,069,535 | B2 | 7/2021 | Lai et al. |
| 11,239,094 | B2 | 2/2022 | Kanarik |
| 2001/0053585 | A1 | 12/2001 | Kikuchi et al. |
| 2002/0009883 | A1 | 1/2002 | Ogure et al. |
| 2002/0058409 | A1 | 5/2002 | Lin et al. |
| 2002/0081381 | A1 | 6/2002 | DelaRosa et al. |
| 2004/0004056 | A1 | 1/2004 | Sasaki et al. |
| 2004/0137749 | A1 | 7/2004 | Ying et al. |
| 2004/0209476 | A1 | 10/2004 | Ying et al. |
| 2005/0006222 | A1 | 1/2005 | Ding et al. |
| 2005/0098440 | A1 | 5/2005 | Kailasam et al. |
| 2005/0112901 | A1 | 5/2005 | Ji et al. |
| 2005/0167399 | A1 | 8/2005 | Ludviksson et al. |
| 2006/0009040 | A1 | 1/2006 | Tomioka et al. |
| 2006/0169669 | A1 | 8/2006 | Zojaji et al. |
| 2006/0194435 | A1 | 8/2006 | Nishimura et al. |
| 2007/0049036 | A1 | 3/2007 | Huang |
| 2007/0202254 | A1 | 8/2007 | Ganguli et al. |
| 2007/0238301 | A1 | 10/2007 | Cabral et al. |
| 2007/0246442 | A1 | 10/2007 | America et al. |
| 2009/0020884 | A1 | 1/2009 | Lee et al. |
| 2009/0075472 | A1 | 3/2009 | Arnold et al. |
| 2009/0226611 | A1 | 9/2009 | Suzuki et al. |
| 2009/0256220 | A1 | 10/2009 | Horng et al. |
| 2010/0048029 | A1 | 2/2010 | Kumar et al. |
| 2010/0190341 | A1 | 7/2010 | DelaRosa et al. |
| 2011/0139748 | A1 | 6/2011 | Donnelly et al. |
| 2011/0200762 | A1 | 8/2011 | Kumar et al. |
| 2011/0212274 | A1 | 9/2011 | Selsley |
| 2011/0237043 | A1 | 9/2011 | Kim et al. |
| 2011/0256734 | A1 | 10/2011 | Donnelly et al. |
| 2012/0009785 | A1 | 1/2012 | Chandrashekar et al. |
| 2012/0115329 | A1 | 5/2012 | Chandrashekar et al. |
| 2012/0193597 | A1 | 8/2012 | Shingu et al. |
| 2012/0276657 | A1 | 11/2012 | Joubert et al. |
| 2013/0023125 | A1 | 1/2013 | Singh |
| 2013/0084708 | A1 | 4/2013 | Jain et al. |
| 2013/0105303 | A1 | 5/2013 | Lubomirsky et al. |
| 2013/0129922 | A1 | 5/2013 | Hausmann et al. |
| 2013/0137267 | A1 | 5/2013 | Sasagawa et al. |
| 2013/0168354 | A1 | 7/2013 | Kanarik |
| 2013/0330926 | A1 | 12/2013 | Chandrashekar et al. |
| 2014/0134847 | A1 | 5/2014 | Seya |
| 2014/0170853 | A1 | 6/2014 | Shamma et al. |
| 2014/0193979 | A1 | 7/2014 | Or et al. |
| 2014/0349469 | A1 | 11/2014 | Shamma et al. |
| 2015/0037972 | A1 | 2/2015 | Danek et al. |
| 2015/0144154 | A1* | 5/2015 | Cho ............. H01J 37/32862 134/1.1 |
| 2015/0162168 | A1 | 6/2015 | Oehrlein et al. |
| 2015/0214474 | A1 | 7/2015 | Nishimura et al. |
| 2015/0228495 | A1* | 8/2015 | Joubert ............ H01L 21/31116 438/714 |
| 2015/0243883 | A1 | 8/2015 | Swaminathan et al. |
| 2015/0270140 | A1 | 9/2015 | Gupta et al. |
| 2015/0345029 | A1 | 12/2015 | Wang et al. |
| 2015/0354061 | A1 | 12/2015 | Wang et al. |
| 2016/0013063 | A1 | 1/2016 | Ranjan et al. |
| 2016/0020152 | A1 | 1/2016 | Posseme |
| 2016/0064244 | A1 | 3/2016 | Agarwal et al. |
| 2016/0099133 | A1 | 4/2016 | Dhas et al. |
| 2016/0203995 | A1 | 7/2016 | Kanarik et al. |
| 2016/0308112 | A1 | 10/2016 | Tan et al. |
| 2016/0314985 | A1 | 10/2016 | Yang et al. |
| 2016/0358782 | A1 | 12/2016 | Lai et al. |
| 2016/0379824 | A1 | 12/2016 | Wise et al. |
| 2016/0381060 | A1 | 12/2016 | Yang et al. |

(56) References Cited

U.S. PATENT DOCUMENTS

| | | |
|---|---|---|
| 2017/0040214 A1 | 2/2017 | Lai et al. |
| 2017/0053808 A1 | 2/2017 | Lai et al. |
| 2017/0053810 A1 | 2/2017 | Yang et al. |
| 2017/0069462 A1 | 3/2017 | Kanarik et al. |
| 2017/0117159 A1 | 4/2017 | Kanarik et al. |
| 2017/0170036 A1 | 6/2017 | Fischer et al. |
| 2017/0178920 A1 | 6/2017 | Dole et al. |
| 2017/0186621 A1 | 6/2017 | Zaitsu |
| 2017/0229311 A1 | 8/2017 | Tan et al. |
| 2017/0229314 A1 | 8/2017 | Tan et al. |
| 2017/0243755 A1 | 8/2017 | Tapily |
| 2017/0256416 A1 | 9/2017 | Fischer et al. |
| 2017/0316935 A1 | 11/2017 | Tan et al. |
| 2018/0005850 A1* | 1/2018 | Citla ................ H01L 21/31116 |
| 2018/0019387 A1 | 1/2018 | Tan et al. |
| 2018/0033635 A1 | 2/2018 | Kanarik et al. |
| 2018/0102236 A1 | 4/2018 | Yang et al. |
| 2018/0174860 A1 | 6/2018 | Kanarik |
| 2018/0182634 A1 | 6/2018 | Kanarik |
| 2018/0233325 A1 | 8/2018 | Kanarik et al. |
| 2018/0240682 A1 | 8/2018 | Lai et al. |
| 2018/0308680 A1 | 10/2018 | Smith et al. |
| 2018/0308695 A1 | 10/2018 | Reddy et al. |
| 2018/0327913 A1 | 11/2018 | Lansalot-Matras et al. |
| 2018/0337046 A1 | 11/2018 | Kanarik et al. |
| 2018/0350624 A1 | 12/2018 | Kanarik et al. |
| 2019/0108982 A1 | 4/2019 | Kanarik et al. |
| 2019/0131130 A1 | 5/2019 | Smith et al. |
| 2019/0139778 A1 | 5/2019 | Yang et al. |
| 2019/0244805 A1 | 8/2019 | Tan et al. |
| 2019/0312194 A1 | 10/2019 | Tan et al. |
| 2020/0118835 A1 | 4/2020 | Kanarik et al. |
| 2020/0286743 A1 | 9/2020 | Lai et al. |
| 2020/0402770 A1 | 12/2020 | Yang et al. |
| 2021/0305059 A1 | 9/2021 | Lai et al. |

FOREIGN PATENT DOCUMENTS

| | | |
|---|---|---|
| CN | 1552097 A | 12/2004 |
| CN | 1568376 A | 1/2005 |
| CN | 1675517 A | 9/2005 |
| CN | 101015047 A | 8/2007 |
| CN | 101351869 A | 1/2009 |
| CN | 101388359 A | 3/2009 |
| CN | 101631894 A | 1/2010 |
| CN | 101809711 A | 8/2010 |
| CN | 103748658 A | 4/2014 |
| CN | 104249070 A | 12/2014 |
| CN | 104651893 A | 5/2015 |
| CN | 105308723 A | 2/2016 |
| CN | 105390437 A | 3/2016 |
| CN | 105789027 A | 7/2016 |
| EP | 0987745 A1 | 2/2000 |
| EP | 1469511 A2 | 10/2004 |
| JP | H03-133128 A | 6/1991 |
| JP | H03263827 A | 11/1991 |
| JP | 06-326060 A | 11/1994 |
| JP | 2000-323483 A | 11/2000 |
| JP | 2002-510146 A | 4/2002 |
| JP | 2002-537645 A | 11/2002 |
| JP | 2004-349687 A | 12/2004 |
| JP | 2010283357 A | 12/2010 |
| JP | 2012529777 A | 11/2012 |
| JP | 5416280 B2 | 11/2013 |
| JP | 2013235912 A | 11/2013 |
| JP | 2015-002312 A | 1/2015 |
| JP | 2016028424 A | 2/2016 |
| JP | 2016208031 A | 12/2016 |
| KR | 2011-0098683 A | 9/2011 |
| KR | 2012-0005992 A | 1/2012 |
| KR | 2014-0051962 A | 5/2014 |
| KR | 2014-0116453 A | 10/2014 |
| TW | 200425247 A | 11/2004 |
| TW | 201140687 A | 11/2011 |
| TW | 201140687 A | 11/2011 |
| TW | 201219595 A | 5/2012 |
| TW | 201340209 A | 10/2013 |
| TW | 201643958 A | 12/2016 |
| WO | WO 9936956 A1 | 7/1999 |
| WO | WO 0049202 A2 | 8/2000 |
| WO | WO 02/091461 A2 | 11/2002 |
| WO | WO 03/031674 A1 | 4/2003 |
| WO | WO 2011/081921 A2 | 7/2011 |
| WO | WO2011/081921 A2 | 7/2011 |
| WO | WO2016/160778 A1 | 10/2016 |
| WO | WO 2017-099718 | 6/2017 |
| WO | WO 2016/100873 A1 | 6/2019 |

OTHER PUBLICATIONS

U.S. Final Office Action dated Sep. 23, 2016 issued in U.S. Appl. No. 14/749,285.

U.S. Office Action dated Feb. 17, 2017 issued in U.S. Appl. No. 14/749,285.

U.S. Final Office Action dated Mar. 30, 2017 issued in U.S. Appl. No. 14/749,285.

U.S. Office Action dated Aug. 11, 2017 issued in U.S. Appl. No. 14/749,285.

U.S. Notice of Allowance dated Sep. 29, 2017 issued in U.S. Appl. No. 14/749,285.

U.S. Office Action dated Sep. 19, 2019 issued in U.S. Appl. No. 15/824,987.

U.S. Final Office Action dated Mar. 5, 2020 issued in U.S. Appl. No. 15/824,987.

U.S. Notice of Allowance dated May 11, 2020 issued in U.S. Appl. No. 15/824,987.

U.S. Office Action dated Nov. 28, 2016 issued in U.S. Appl. No. 14/749,291.

U.S. Notice of Allowance dated Jun. 30, 2017 issued in U.S. Appl. No. 14/749,291.

U.S. Office Action dated Dec. 14, 2018 issued in U.S. Appl. No. 15/719,497.

U.S. Notice of Allowance dated Mar. 22, 2019 issued in U.S. Appl. No. 15/719,497.

U.S. Office Action dated Jul. 1, 2016 issued in U.S. Appl. No. 14/830,683.

U.S. Final Office Action dated Feb. 7, 2017 issued in U.S. Appl. No. 14/830,683.

U.S. Office Action dated Jul. 25, 2017 issued in U.S. Appl. No. 14/830,683.

U.S. Notice of Allowance dated Jan. 11, 2018 issued in U.S. Appl. No. 14/830,683.

U.S. Office Action dated May 1, 2019 issued in U.S. Appl. No. 15/954,509.

U.S. Final Office Action dated Jan. 3, 2020 issued in U.S. Appl. No. 15/954,509.

U.S. Office Action dated Aug. 25, 2017 issued in U.S. Appl. No. 15/239,138.

U.S. Notice of Allowance dated May 10, 2018 issued in U.S. Appl. No. 15/239,138.

U.S. Office Action dated Nov. 29, 2017 issued in U.S. Appl. No. 15/421,189.

U.S. Notice of Allowance dated Apr. 25, 2018 issued in U.S. Appl. No. 15/421,189.

U.S. Office Action dated Mar. 24, 2017 issued in U.S. Appl. No. 15/286,421.

U.S. Notice of Allowance dated Sep. 28, 2017 issued in U.S. Appl. No. 15/286,421.

U.S. Notice of Allowance [Supplemental] dated Oct. 26, 2017 issued in U.S. Appl. No. 15/286,421.

U.S. Office Action dated Apr. 10, 2019 issued in U.S. Appl. No. 15/841,205.

U.S. Final Office Action dated Sep. 16, 2019 issued in U.S. Appl. No. 15/841,205.

U.S. Notice of Allowance dated Dec. 2, 2019 issued in U.S. Appl. No. 15/841,205.

U.S. Office Action dated Sep. 6, 2019 issued in U.S. Appl. No. 16/049,320.

(56) References Cited

OTHER PUBLICATIONS

U.S. Notice of Allowance dated Dec. 2, 2019 issued in U.S. Appl. No. 16/049,320.
PCT International Search Report and Written Opinion dated Feb. 25, 2016 issued in PCT/US2015/066789.
Chinese First Office Action dated Jun. 26, 2018 issued in Application No. CN 201610255293.7.
Chinese Second Office Action dated Feb. 3, 2019 issued in Application No. CN 201610255293.7.
Singapore Search Report and Written Opinion dated Jul. 9, 2018 issued in Application No. SG 10201603092R.
Taiwanese Notice of Allowance dated Dec. 27, 2019 issued in Application No. TW 105112529.
Japanese First Office Action dated Jun. 2, 2020 issued in Application No. JP 2016-082061.
Chinese First Office Action dated Mar. 30, 2018 issued in CN 201610248296.8.
Chinese Second Office Action dated Dec. 27, 2018 issued in CN 201610248296.8.
Singapore Search Report and Written Opinion dated Jun. 28, 2018 issued in SG 10201603090V.
Chinese First Office Action dated Aug. 28, 2018 issued in CN 201610643282.6.
Chinese Second Office Action dated Apr. 22, 2019 issued in CN CN 201610643282.6.
Chinese Third Office Action dated Sep. 27, 2019 issued in CN 201610643282.6.
Chinese Notification of Reexamination dated Jun. 15, 2020 issued in CN 201610643282.6.
Taiwanese First Office Action dated Mar. 17, 2020 issued in TW 105124539.
Korean First Office Action [No. Translation] dated Nov. 29, 2020 issued in KR 10-2016-0099470.
Chinese First Office Action dated Jan. 9, 2019 issued in CN 201610694927.9.
Chinese Second Office Action dated Jun. 17, 2019 issued in CN 201610694927.9.
Chinese Third Office Action dated Dec. 20, 2019 issued in CN 201610694927.9.
Chinese Fourth Office Action dated Sep. 8, 2020 issued in CN 201610694927.9.
Singapore Notice of Eligibility for Grant and Supplementary Examination Report dated Jan. 9, 2020.
Chinese First Office Action dated Aug. 28, 2019 issued in CN 201710066218.0.
Taiwanese First Office Action dated Jul. 23, 2020 issued in TW 106103603.
Chinese First Office Action dated Apr. 3, 2020 issued in CN 201710604639.4.
International Search Report and Written Opinon dated Apr. 5, 2018 issued in PCT/US2017/066470.
International Preliminary Report on Patentability dated Jul. 4, 2019 issued in Application No. PCT/US2017/066470.
International Preliminary Report on Patentability dated Oct. 15, 2020 issued in Application No. PCT/US2019/022520.
Carver et al. (Feb. 20, 2015) "Atomic Layer Etching: An Industry Perspective," ECS Journal of Solid State Science and Technology,4(6):N5005-N5009.
"Faraz et al., (Mar. 24, 2015)""Atomic Layer Etching: What Can We Learn from Atomic Layer Deposition?," ECS Journal of Solid State Science and Technology, 4(6):N5023-N5032.
Kanarik et al. (Mar./Apr. 2015) "Overview of atomic layer etching in the semiconductor industry," J. Vac. Sci. Technol. A 33(2):020802-1-020802-14.
Kanarik et al. (2017) "Predicting synergy in atomic layer etching," J. Vac. Sci. Technol. A,35(5):05C302-1 through 05C302-7.
Kanarik et al. (Nov. 2016) "Tech Brief: All About ALE" [webpage] pp. 1-3, <URL:https://blog.lamresearch.com/tech-brief-all-about-ale/>.
Lee et al. (2015) "Atomic Layer Etching of Al2O3 Using Sequential, Self-Limiting Thermal Reactions with Sn(acac)2 and Hydrogen Fluoride," ACSNANO,9(2):2061-2070.
Wolf, S. and Tauber, R.N. (1986) "Silicon Processing for the VLSI Era," vol. 1—Process Technology, Lattice Press, pp. 542-557.
U.S. Office Action dated Aug. 7, 2017 issued in U.S. Appl. No. 15/253,481.
U.S. Final Office Action dated Jan. 25, 2018 issued in U.S. Appl. No. 15/253,481.
U.S. Notice of Allowance dated Feb. 12, 2018 issued in U.S. Appl. No. 15/253,481.
U.S. Office Action dated Jan. 2, 2019 issued in U.S. Appl. No. 15/952,834.
U.S. Notice of Allowance dated Apr. 4, 2019 issued in U.S. Appl. No. 15/952,834.
U.S. Office Action dated Oct. 10, 2018 issued in U.S. Appl. No. 15/423,486.
U.S. Office Action dated Feb. 26, 2019 issued in U.S. Appl. No. 15/423,486.
US Final Office Action dated Nov. 15, 2019 issued in U.S. Appl. No. 15/423,486.
U.S. Notice of Allowance dated Mar. 25, 2020 issued in U.S. Appl. No. 15/423,486.
U.S. Office Action dated Apr. 19, 2018 issued in U.S. Appl. No. 15/494,245.
U.S. Notice of Allowance dated Dec. 13, 2018 issued in U.S. Appl. No. 15/494,245.
U.S. Office Action dated Jan. 14, 2019 issued in U.S. Appl. No. 15/799,675.
U.S. Final Office Action dated Jul. 25, 2019 issued in U.S. Appl. No. 15/799,675.
U.S. Office Action dated Dec. 12, 2019 issued in U.S. Appl. No. 15/799,675.
U.S. Final Office Action dated Apr. 1, 2020 issued in U.S. Appl. No. 15/799,675.
Taiwan First Office Action dated Sep. 19, 2019 issued in Application No. TW 105128324.
Taiwan Notice of Allowance dated Feb. 5, 2020 issued in Application No. TW 105128324.
Chinese First Office Action dated Nov. 4, 2019 issued in Application No. CN 201710064610.1.
Chinese Second Office Action dated Jul. 3, 2020 issued in Application No. CN 201710064610.1.
Taiwanese First Office Action dated Aug. 27, 2020 issued in Application No. TW 106103618.
International Search Report and Written Opinion dated Feb. 25, 2019 issued in Application No. PCT/US2018/055065.
International Preliminary Report on Patentability dated May 14, 2020 issued in Application No. PCT/US2018/055065.
Boullart et al. (Mar. 29, 2013) "STT MRAM patterning challenges," Proc. SPIE , Advanced Etch Technology for Nanopatterning II, Proc. of SPIE 8685:86850F-1-86850F-9 [Retrieved on Jun. 2, 2015 from http://proceedings.spiedigitallibrary.org].
Ditizio, Robert and Werbaneth, Paul, Tegal Corporation and Zhu, Jian-Gang, Carnegie Mellon University (Jan. 2004) "Cell Shape and Patterning Considerations for Magnetic Random Access Memory (MRAM) Fabrication," Reprinted with permission from Semiconductor Manufacturing Magazine, 7 PP.
Jiang et al. (1998) "Complexes Containing Unbridged Dative Metal-Metal Bonds and the Strong Acceptor Ru(CO)3(SiCl3)2 Moiety. Comments on the Transition Metal to Silicon Bond," Organometallics, 17(26):5810-5819.
Kim et al. (Nov./Dec. 2013) "Atomic layer etching removal of damaged layers in a contact hole for low sheet resistance," J. Vac. Sci. Technol. A, 31(6):061302-1-061302-7.
Moroz, Paul (Jul. 1-2, 2015) "Numerical Simulation of Atomic Layer Etching," Atomic Layer Etching Workshop, Portland, Oregon, USA; Tokyo Electron U.S. Holdings, Inc., 15pp.
Park, S.D. et al., (Sep. 22, 2005) "Surface Roughness Variation during Si Atomic Layer Etching by Chlorine Adsorption Followed by an Ar Neutral Beam Irradiation," Electrochemical and Solid-State Letters, 8(11):C177-C179, 1 page [Abstract Only].

(56) References Cited

OTHER PUBLICATIONS

Pomeroy, R.K. and Wijesekera, K.S. (1980) "Preparation and derivatives of cis-M(CO)4(SiCl3)2 (M=Fe, Ru, Os)," Inorg. Chem., 19(12):3729-3735.
Schmitt et al. (2006) "Synthesis and Properties of Single-Crystal FeSi Nanowires," Nano Lett., 6(8):1617-1621.
Schmitt et al. (Feb. 1, 2008) "Chemical Synthesis and Magnetotransport of Magnetic Semiconducting Fe1-xCoxSi Alloy Nanowires," Nano Lett., 8(3):810-815.
Office Action dated Aug. 23, 2019 issued in U.S. Appl. No. 16/148,939.
Notice of Allowance dated Apr. 29, 2020 issued in U.S. Appl. No. 16/148,939.
Office Action dated Jun. 17, 2016 issued in U.S. Appl. No. 14/696,254.
Notice of Allowance dated Oct. 14, 2016 issued in U.S. Appl. No. 14/696,254.
Notice of Allowance dated Jun. 29, 2017 issued in U.S. Appl. No. 15/400,368.
Office Action dated Mar. 29, 2018 issued in U.S. Appl. No. 15/719,484.
Notice of Allowance dated Sep. 11, 2018 issued in U.S. Appl. No. 15/719,484.
Office Action dated May 31, 2019 issued in U.S. Appl. No. 16/220,583.
Notice of Allowance dated Aug. 21, 2019 issued in U.S. Appl. No. 16/220,583.
International Search Report and Written Opinion dated Feb. 1, 2019 issued in Application No. PCT/US2018/054001.
International Preliminary Report on Patentability dated Apr. 16, 2020 issued in Application No. PCT/US2018/054001.
Chinese First Office Action dated Dec. 27, 2017 issued in Application No. CN 201610017911.4.
Chinese Second Office Action dated Aug. 31, 2018 issued in Application No. CN 201610017911.4.
Chinese Third Office Action dated Mar. 4, 2019 issued in Application No. CN 201610017911.4.
Chinese Fourth Office Action dated Sep. 29, 2019 issued in Application No. CN 201610017911.4.
Chinese First Office Action dated Aug. 5, 2019 issued in Application No. CN 201810642746.0.
Singapore Search Report and Written Opinion dated Jun. 14, 2018 issued in Application No. SG 10201600099V.
Taiwan First Office Action dated Jul. 18, 2019 issued in Application No. TW 105100640.
Japanese First Office Action dated Jan. 28, 2020 issued in Application No. JP 2016-002141.
Happich, J., [webpage] "Atomic layer etching yields 2.5nm wide FinHETs," eeNews Europe, Dec. 10, 2018, pp. 4. [retrieved Dec. 12, 2018 <URL:http://www.eenewseurope.com/news/atomic-layer-etching-yields-25nm-wide-finfets/page/0/1>.
Kanarik et al., "Overview of atomic layer etching in the semiconductor industry," Journal of Vacuum Science & Technology A, vol. 33, No. 2, Mar. 5, 2015, pp. 1-14. <doi:10.1116/1.4913379>.
U.S. Appl. No. 17/008,244, filed Sep. 24, 2020, Yang et al.
Kanarik KJ, Tan S, Gottscho RA. Atomic layer etching: rethinking the art of etch. The journal of physical chemistry letters. Aug. 10, 2018;9(16):4814-21.
International Search Report and the Written Opinion of the International Searching Authority, dated Jun. 28, 2019, for International Patent Application No. PCT/US2019/022520.
U.S. Office Action dated Dec. 10, 2020 issued in U.S. Appl. No. 15/929,854.
U.S. Notice of Allowance dated Mar. 19, 2021 issued in U.S. Appl. No. 15/929,854.
U.S. Office Action dated Feb. 26, 2021 issued in U.S. Appl. No. 16/717,385.
U.S. Final Office Action dated Jul. 9, 2021 issued in U.S. Appl. No. 16/717,385.
Japanese Second Office Action dated Jan. 21, 2021 issued in Application No. JP 2016-082061.
Chinese Reexamination Decision dated Jan. 22, 2021 issued in CN 201610643282.6.
Taiwanese Second Office Action dated Feb. 25, 2021 issued in TW 105124539.
Korean Second Office Action dated May 27, 2021 issued in KR 10-2016-0099470.
Chinese Reexamination Decision dated Mar. 2, 2021 issued in CN 201610694927.9.
Taiwanese First Office Action dated Jun. 17, 2021 issued in Application No. TW 106144335.
U.S. Appl. No. 17/304,174, filed Jun. 15, 2021, Lai et al.
EP Search Report dated Nov. 22, 2021, in Application No. EP19778362.4.
Extended European Search Report dated Jun. 15, 2021 issued in EPO Application No. EP 18864801.8.
JP Office Action dated Jan. 5, 2022, in Application No. JP2019-533041 with English translation.
KR Office Action dated Dec. 19, 2021, in Application No. KR1020210133301 with English translation.
KR Office Action dated Oct. 31, 2021, in Application No. KR1020210133296 with English translation.
Min, K.S. et al., "Atomic layer etching of $Al_2O_3$ using $BCl_3$/Ar for the interface passivation layer of III—V MOS devices", Microelectronic Engineering, Apr. 9, 2013, vol. 110, pp. 457-460.
TW Office Action dated Jan. 14, 2022, in Application No. TW106144335 with English translation.
U.S. Notice of Allowance dated Sep. 22, 2021 issued in U.S. Appl. No. 16/717,385.
U.S. Appl. No. 17/457,909, inventor Kanarik, filed Dec. 6, 2021.

\* cited by examiner

ATOMIC LAYER ETCHING AND SMOOTHING OF REFRACTORY METALS AND OTHER HIGH SURFACE BINDING ENERGY MATERIALS

CROSS-REFERENCE TO RELATED APPLICATIONS

This application claims priority to U.S. Provisional Patent Application No. 62/650,469, filed Mar. 30, 2018, titled ATOMIC LAYER ETCHING AND SMOOTHING OF REFRACTORY METALS AND OTHER HIGH SURFACE BINDING ENERGY MATERIALS, which is incorporated herein by reference in its entirety and for all purposes.

This application also incorporates by reference the following U.S. patent applications: U.S. patent application Ser. No. 15/253,481, filed Aug. 31, 2016, and titled "ALE SMOOTHNESS: IN AND OUTSIDE SEMICONDUCTOR INDUSTRY" and U.S. patent application Ser. No. 15/841,205, filed Dec. 13, 2017, and titled "DESIGNER ATOMIC LAYER ETCHING," for their disclosures relating to atomic layer etching of refractory metals.

BACKGROUND

Semiconductor fabrication processes include etching of various materials. As feature sizes shrink, there is a growing need for atomic scale processing such as Atomic Layer Etch (ALE).

SUMMARY

Etch processes that yield smooth, in at least some cases extremely smooth, etch front and line edge for refractory metals and other high surface binding energy materials, and in some cases improved selectivity to surrounding materials, are disclosed. Certain Atomic Layer Etch (ALE) processes have been demonstrated on refractory metals such as Mo, Ta and Ru, and could be used to process a variety of materials composed of grains. While ALE can be used for directional pattern transfer to produce smooth metal lines, it can also be applied for other purposes. For example, it is desired for both reliability and device electrical performance, to provide conformal liners (e.g., diffusion barrier or adhesion promoting layer) that are continuous, smooth and atomically thin. If, for example, an as-deposited liner is thicker and/or rougher than desired as deposited, ALE etchback may be utilized to appropriately thin and smooth the liner at the same time, thereby providing the desired result.

According to various embodiments, a method of etching a refractory metal or other high surface binding energy (high EO) material on a substrate is provided. The method can include providing a substrate comprising an exposed refractory metal/high EO surface, exposing the refractory metal/high EO surface to a modification gas to modify the surface and form a modified refractory metal/high EO surface, and exposing the modified refractory metal/high EO surface to an energetic particle to preferentially remove the modified refractory metal/high EO surface relative to an underlying unmodified refractory metal/high EO surface. The exposed refractory metal/high EO surface after removing the modified refractory metal/high EO surface is as smooth or smoother than the substrate surface before exposing the substrate surface to the modification gas.

The smoothness of the refractory metal/high EO surface may be maintained or increased by the method, for example by more than 10% RMS, more than 20%, more than 30%, more than 40%, more than 50%, more than 60%, more than 70%, 75% or more, more than 80%, or more than 90% RMS, on the order of an order of magnitude increase in smoothness.

The refractory metal/high EO surface may be a refractory metal selected from the group of Nb, Mo, Ta, W, Re, Ru, Rh, Os, Ir, Ti, V, Cr, Zr and Hf. For example, the refractory metal may be selected from the group of Mo, Ta and Ru.

The modification gas may include $O_2$, or another oxygen-containing gas.

The modification gas may include $Cl_2$, or another chlorine-containing gas.

The modification gas may include a mixture of $O_2$, or another oxygen-containing gas and $Cl_2$, or another chlorine containing gas.

The energetic particle may be an inert ion plasma, such as an Ar plasma.

A modification gas mixture selective to refractory metal may be used.

The refractory metal/high $E_O$ may be a material selected from the group of oxides such as $Al_2O_3$, $In_2O_3$, MgO, SnO, $Ta_2O_5$, $TiO_2$ and $ZrO_2$; carbides such as BC, SiC and WC; nitrides such as BN, TaN, TiN; sulfides such as ZnS and MoS2; and superconductors such as YBCO.

The substrate surface may be smoothened for semiconductor or non-semiconductor processing applications.

An apparatus configured for processing a substrate is also provided. The apparatus may include a process chamber comprising a showerhead and a substrate support for holding the substrate having a material, a plasma generator, and a controller having at least one processor and a memory. The at least one processor and the memory may be communicatively connected with one another, the at least one processor may be at least operatively connected with flow-control hardware, and the memory may store machine-readable instructions for etching a refractory metal/high EO on a substrate, the instructions comprising: providing a substrate comprising an exposed refractory metal/high EO surface; exposing the refractory metal/high EO surface to a modification gas to modify the surface and form a modified refractory metal/high EO surface; and exposing the modified refractory metal surface to an energetic particle to preferentially remove the modified refractory metal/high EO surface relative to an underlying unmodified refractory metal/high EO surface. The exposed refractory metal/high EO surface after removing the modified refractory metal/high EO surface is as smooth or smoother than the substrate surface before exposing the substrate surface to the modification gas.

These and other aspects of this disclosure are further described in the detailed description that follows, including with reference to the figures.

DETAILED DESCRIPTION

Figure 1:
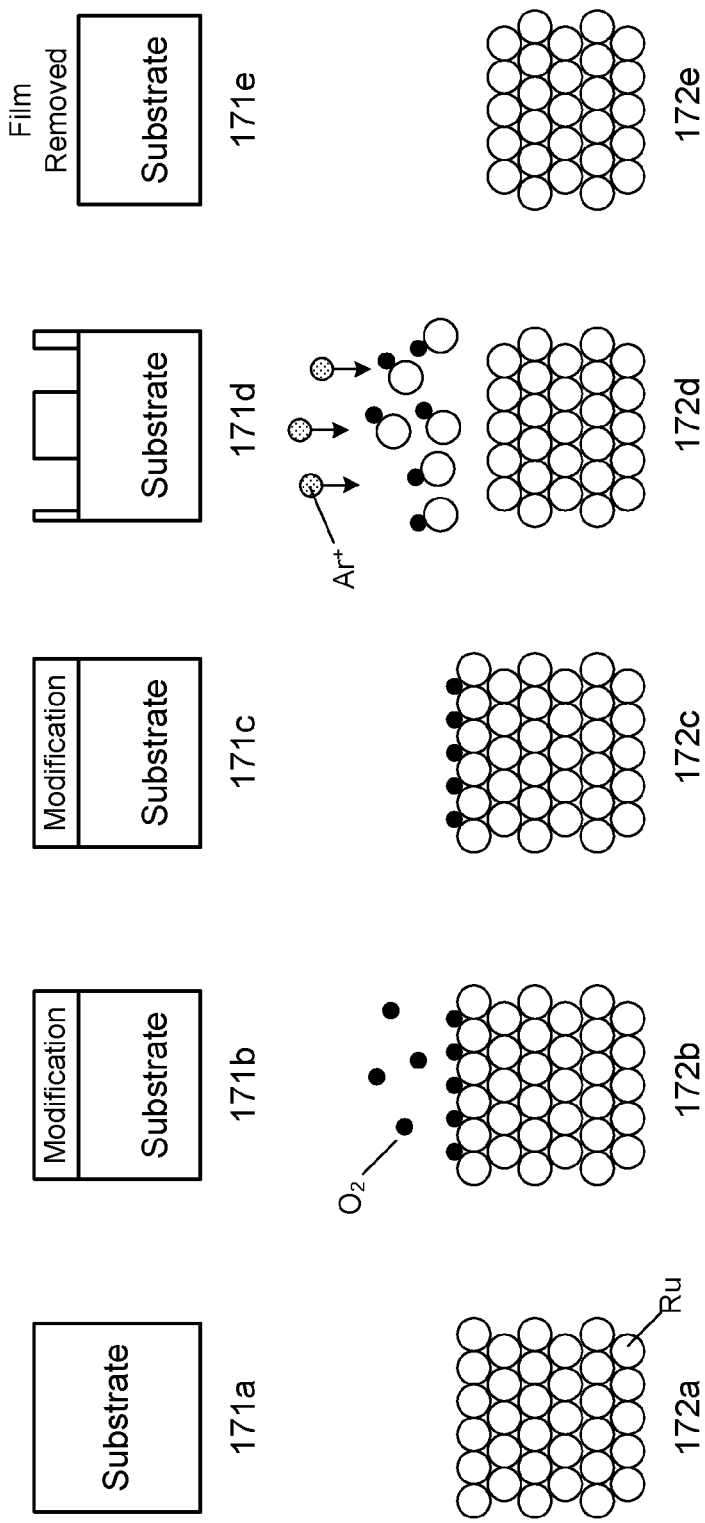
FIG. 1 shows two example schematic illustrations of an ALE cycle in accordance with embodiments of this disclosure.

In the following description, numerous specific details are set forth to provide a thorough understanding of the presented embodiments. The disclosed embodiments may be practiced without some or all of these specific details. In other instances, well-known process operations have not been described in detail to not unnecessarily obscure the disclosed embodiments. While the disclosed embodiments will be described in conjunction with the specific embodiments, it will be understood that it is not intended to limit the disclosed embodiments.

Etching processes often involve exposing a material to be etched to a combination of etching gases to remove the material. However, such removal may in some cases etch more than desired, or result in an undesirable feature profile. As feature sizes shrink, there is a growing need for atomic scale processing.

Some reactive ion etch (RIE) regimes are known to improve line width roughness (LWR) of sidewalls, however rarely less than 2 nm. Moreover, at the etch front in RIE, stochastic behavior forming the selvage layer tends to roughen the surface on a similar scale to 5 nm. There are many proposed mechanisms for why RIE would roughen the surface, including stochastic effects, ion-scattering, and micro-masking. These mechanisms kinetically hinder flattening of the surface, which would be thermodynamically favorable due to lower surface tension.

Smooth etch lines are increasingly desirable to help meet electric requirements for advanced semiconductor manufacturing. As feature size continues to shrink, the critical dimension of metals lines reaches the sub-10 nm regime. However metals have a crystalline grain structure. Reactive ion etching typically has a faster reaction rate at grain boundaries than on the crystalline grains themselves. This preferential etch at the metal grain boundaries generates line edge roughness that causes variation and increases resistivity of metal contact lines.

Etch processes that yield smooth, in at least some cases extremely smooth (e.g., up to 50% or more, 60% or more, 70% or more, 75% or more, 80% or more, or 90% or more root mean square (RMS) smoother than pre-etch surface roughness) etch front and line edge for refractory metals and other high surface binding energy materials, and in some cases improved selectivity to surrounding materials, are disclosed. Certain Atomic Layer Etch (ALE) processes have been demonstrated on refractory metals such as Mo, Ta and Ru, and could be used to process a variety of materials composed of grains. While ALE can be used for directional pattern transfer to produce smooth metal lines, it can also be applied for other purposes. In this regard, it is desired for both reliability and device electrical performance, to provide conformal liners (e.g., diffusion barrier or adhesion promoting layer) that are continuous, smooth and atomically thin. If, for example, an as-deposited liner is thicker and/or rougher than desired as deposited, ALE etchback may be utilized to appropriately thin and smooth the liner at the same time, thereby providing the desired result.

ALE is a multi-step process used in advanced semiconductor manufacturing (e.g. technology node <10 nm) for the blanket removal or pattern-definition etching of ultra-thin layers of material with atomic scale in-depth resolution and control. ALE is a technique that removes thin layers of material using sequential self-limiting reactions. Examples of atomic layer etch techniques are described in U.S. Pat. Nos. 8,883,028 and 8,808,561, which are herein incorporated by reference for purposes of describing example atomic layer etch and etching techniques.

The concept of an "ALE cycle" is relevant to the discussion of various embodiments herein. Generally an ALE cycle is the minimum set of operations used to perform an etch process one time, such as etching a monolayer. The result of one cycle is that at least some of a film layer on a substrate surface is etched. Typically, an ALE cycle includes a modification operation to form a modified layer, followed by a removal operation to remove or etch only this modified layer. The cycle may include certain ancillary operations such as sweeping, or purging, one of the reactants or byproducts. Generally, a cycle contains one instance of a unique sequence of operations. As an example, an ALE cycle may include the following operations: (i) delivery of a modification gas, (ii) purging of the reactant gas from the chamber, (iii) delivery of a removal gas and an optional plasma, and (iv) purging of the chamber. In some embodiments, etching may be performed nonconformally, including such that the resulting surface may be smoother, including much smoother, than the starting surface.

FIG. 1 shows two example schematic illustrations of an ALE cycle. Diagrams 171a-171e show a generic ALE cycle. In 171a, the substrate is provided. In 171b, the surface of the substrate is modified. In 171c, the next step is prepared. In 171d, the modified layer is being etched. In 171e, the modified layer is removed. Similarly, diagrams 172a-172e show an example of an ALE cycle for etching a refractory metal film. In 172a, an exposed Ru film surface on a substrate is provided, which includes many Ru metal atoms. In 172b, modification gas, for example including oxygen gas, introduced to the substrate modifies the Ru metal surface of the substrate. The schematic in 172b shows that some modification gas is adsorbed onto the surface of the substrate as an example. Although oxygen is depicted in FIG. 1, a suitable oxygen-containing compound that forms volatile species with the metal atom may be used. In other embodiments, chlorine or suitable chlorine-containing gas that forms volatile species with the metal atom, may be used, or a combination of oxygen and chlorine gases, or suitable oxygen- and chlorine-containing gases, may be used to advantage with particular refractory metals, as further described below. In 172c, the modification gas is purged from the chamber. In 172d, a removal gas such as an inert gas including nitrogen, argon, neon, helium, or combinations thereof, for example argon, is introduced with a plasma, forming argon ions (energetic particles) as indicated by the $Ar^+$ plasma species and arrows, and anisotropic ion bombardment is performed to remove the modified refractory metal surface of the substrate. During this operation, a bias is applied to the substrate to attract ions toward it. In 172e, the chamber is purged and the byproducts are removed.

A cycle may only partially etch about 0.1 nm to about 50 nm of material, or between about 0.1 nm and about 20 nm of material, or between about 0.1 nm and about 2 nm of material, or between about 0.1 nm and about 5 nm of material, or between about 0.2 nm and about 50 nm of material, or between about 0.2 nm and about 5 nm of material. The amount of material etched in a cycle may depend on the purpose of etching in a self-limiting manner. In some embodiments, a cycle of ALE may remove less than a monolayer of material.

ALE process conditions, such as chamber pressure, substrate temperature, plasma power, frequency, and type, and bias power, depend on the material to be etched, the composition of the gases used to modify the material to be etched, the material underlying the material to be etched, and the composition of gases used to remove the modified material.

ALE involves splitting the etch process into two (or more) separate operations: modification (operation A) and removal (operation B). For example, the modification operation modifies the surface layer so that it can be removed easily during the removal operation. A thin layer of material is removed per cycle, where a cycle includes modification and removal, and the cycle can be repeated until the desired depth is reached. Synergy means that favorable etching occurs due to interaction of operations A and B. In ALE, operations A and B are separated in either space or time.

Favorable atomic layer etching occurs due to the interaction of operations A and B, and the following "ALE synergy" metric is used to quantify the strength and impact of the synergistic interaction. ALE synergy is calculated by:

$$ALE\ Synergy\ \% = \frac{EPC - (A + B)}{EPC} \times 100\% \qquad (\text{eqn. 1})$$

where EPC ("etch per cycle") is the thickness of substrate material removed in one ALE cycle, typically averaged over many cycles, and A and B are contributions to the EPC from the stand-alone modification and removal operations, respectfully, measured as reference points by performing these operations independently.

Synergy is a test that captures many aspects of ALE behavior, and is well-suited to compare different ALE conditions or systems. It is an underlying mechanism for why etching in operation B stops after reactants from operation A are consumed. It is therefore responsible for the self-limiting behavior in ALE benefits such as aspect ratio independence, uniformity, smoothness, and selectivity.

Disclosed embodiments are structured to achieve an ALE process with high synergy—the ideal being an ALE process with synergy being 100%. This ideal may not be possible to achieve in all cases given practical considerations such as the accessible range of process conditions, wafer throughput requirements, etc. However, tolerance for synergy less than the ideal of 100% will depend on the application and the technology node, and presumably each successive technology generation will demand higher levels of ideality.

Disclosed embodiments for designing an ALE process with high synergy is based on achieving a hierarchical relationship between energies that characterize an overall ALE process and the energy barriers that are overcome to achieve etch with synergy close to 100%.

This relationship is as follows:

$$E_{mod} < E_{des} < E_O$$

$E_O$, $E_{mod}$, and $E_{des}$ are determined by properties of the material to be etched and the reactant.

$E_O$ is the surface binding energy of the unmodified material and is the cohesive force that keeps atoms from being removed from the surface.

$E_{mod}$ (sometimes $E_{ads}$) is the adsorption barrier to modify the surface and arises from the need to dissociate reactants or reorganize surface atoms.

$E_{des}$ is the desorption barrier, the energy used to remove a by-product from the modified surface.

Disclosed embodiments are suitable for performing ALE of refractory metals, including Nb, Mo, Ta, W, Re, Ru, Rh, Os, Ir, Ti, V, Cr, Zr and Hf, in particular Mo, Ta and Ru. While W has long been integrated and studied in a semiconductor processing contexts, including our recent work on tungsten ALE removal and smoothing, ALE of other refractory metals has not to date been addressed to any significant extent. Anisotropic, or directional, ALE, in particular, is shown herein to provide advantageous smoothing, including extreme smoothing, results on refractory metals not previously studied to significant extent. Other high surface binding energy materials may also benefit from ALE processing as described.

Refractory metals are good candidates for ALE because they have high Eo. As further explained in "Atomic Layer Etching: Rethinking the Art of Etch", Keren J. Kanarik and Richard A. Gottscho, Journal of Physical Chemistry Letters, 9 (16), pp. 4814-4821, 2018, incorporated by reference herein for its explanation of high Eo materials relating to aspects and embodiments according to this disclosure. As explained therein, high Eo materials are expected to do well in terms of high synergy and self-limiting ALE. Excellent candidate ALE elemental materials with $E_O > 6$ eV include C, along with refractory metals, such as W, Ta, Mo, Re, and Ru, for example. Other high surface binding energy (high $E_O$) materials include oxides such as $Al_2O_3$, $In_2O_3$, MgO, SnO, $Ta_2O_5$, $TiO_2$ and $ZrO_2$, carbides such as BC, SiC and WC; nitrides such as BN, TaN, TiN; sulfides such as ZnS and $MoS_2$; and superconductors such as YBCO. While materials with high $E_O$ (e.g., refractory metals and diamond) are known for resistance to heat, wear, and etching, the analysis indicates that when such materials are etched with ALE, it is more controllable (i.e., more ideal due to higher synergy).

Embodiments can be used to develop new or improved unit or integrated processes as well as standalone or clustered hardware for semiconductor processing or other applications. The methodology can be implemented with appropriate computer software for offline use or embedded in a process tool for recipe development, process qualification, or process control. In the following discussion, non-limiting examples are provided for ALE resulting in smoothing, in some cases unexpected extreme smoothing, of molybdenum (Mo), ruthenium (Ru) and Tantalum, for example by more than 10% RMS, more than 20%, more than 30%, more than 40%, or more than 50%, more than 60%, more than 70%, as much as 75% or more, 80% or more, or 90% RMS or more, on the order of an order of magnitude increase in smoothness (decrease in roughness) from the initial film surface roughness.

Within one ALE cycle the reaction rate on the surface has been found to have been equalized, without differentiating grain boundaries from grains. This leads to technical advantages, including:

1) A metal surface can be recessed while maintaining or even decreasing the roughness of the pristine surface as deposited.

2) High selectivity of a metal etch to mask to liner/filling dielectric materials can be achieved by manipulation of the modification gas chemistry. The chemistry can be selected to react with the metal line, while not modifying surrounding materials. The selectivity can be achieved between different metals, and between metals and semiconductor or dielectric materials.

Figure 2:
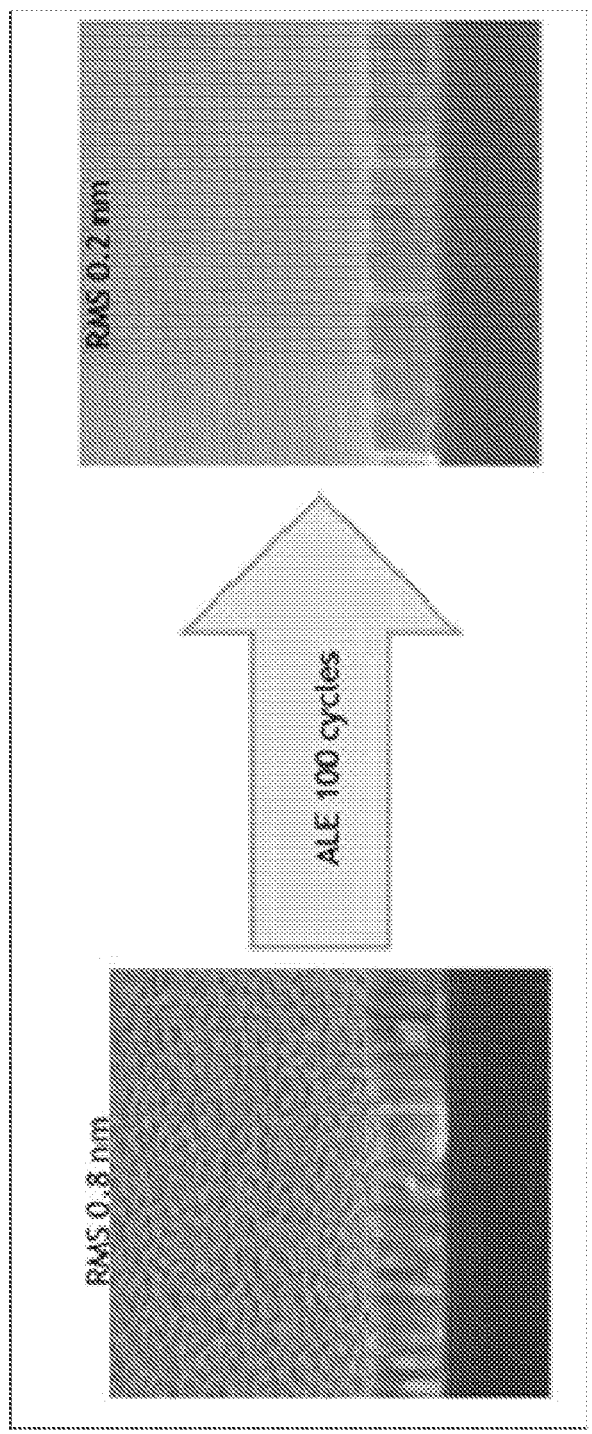
FIG. 2 depicts SEM images of, on the left, an incoming substrate surface with visible damage, roughness, or grain boundaries that are all reduced by ALE, on the right, in accordance with an embodiment of this disclosure.

Results show that ALE can produce an even smoother surface than that on which etching began. Unexpectedly, the effect can be particularly dramatic, producing extreme smoothing, for example more than 50% RMS, more than 60%, more than 70%, more than 75%, more than 80%, or more than 90%; such as for the 75% smoothening after 100 cycles of Ru ALE using $O_2$ as the modification gas and Ar plasma for removal (0.8 nm RMS roughness to 0.2 nm), as seen in FIG. 2. FIG. 2 depicts scanning electron microscope (SEM) images of, on the left, an incoming substrate surface with visible damage, roughness, or grain boundaries that are all reduced by ALE, on the right, in accordance with an embodiment of this disclosure.

Suitable modification gas chemistry can react to form a volatile compound. Thermal desorption temperature measurements can usefully be referenced. Suitable modification gases can include $O_2$, $Cl_2$, $BCl_3$, $H_2$ and $CF_4$. For example, $O_2$ has been shown to be effective for etching and smoothing C, and to provide extreme smoothing of Ru; $Cl_2$ has been shown to be effective for etching and smoothing of Ta and W; and mixtures of $Cl_2$ and $O_2$ have been shown to be effective for etching and smoothing of Mo. And $BCl_3$, $H_2$ and CF4 are effective with the he oxides.

In many instances, high synergy, for example greater than 80%, or above 90%, enhances smoothing.

Suitable conditions can be in the range of:

For operation A (modification):
Pressure: about 50-100 mT, e.g., 50, 60, 70, 80, 90, or 100 mT;
Power: no bias; source power about 100-1000 W, e.g., 100, 200, 300, 400, 500, 600, 700, 800, 900 or 1000 W;
Temperature: material specific, set to avoid spontaneous etching e.g., about −70 to 150° C., e.g., −70, −60, −50, −40, −30, −20, −10, 0, 10, 20, 30, 40, 50, 60, 70, 80, 90, 100, 110, 120, 130, 140 or 150° C.;
Time: about 0.1-5 seconds, e.g., 0.1, 0.2, 0.5, 1, 2, 3, 4 or 5 s.
Operation B (removal):
Pressure: about 0.5-20 mT, e.g., 0.5, 1, 2, 5, 10, 15, 20 mT
Power: bias about 10-150V, e,g., 10, 20, 30, 40, 50, 60, 70, 80, 90, 100, 11, 120, 130, 140, or 150V bias; source power 100-1000 W, e.g., 100, 200, 300, 400, 500, 600, 700, 800, 900 or 1000 W;
Temperature: material specific, set to avoid spontaneous etching e.g., about −70 to 150° C., e.g., −70, −60, −50, −40, −30, −20, −10, 0, 10, 20, 30, 40, 50, 60, 70, 80, 90, 100, 110, 120, 130, 140 or 150° C.;
Time: about 0.1-10 seconds, e.g., 0.1, 0.2, 0.5, 1, 2, 3, 4, 5, 6, 7, 8, 9 or 10 s, for ion flux about $2 \times 10^{16}/cm^2 *S$ at 50 eV.

Figure 3A:
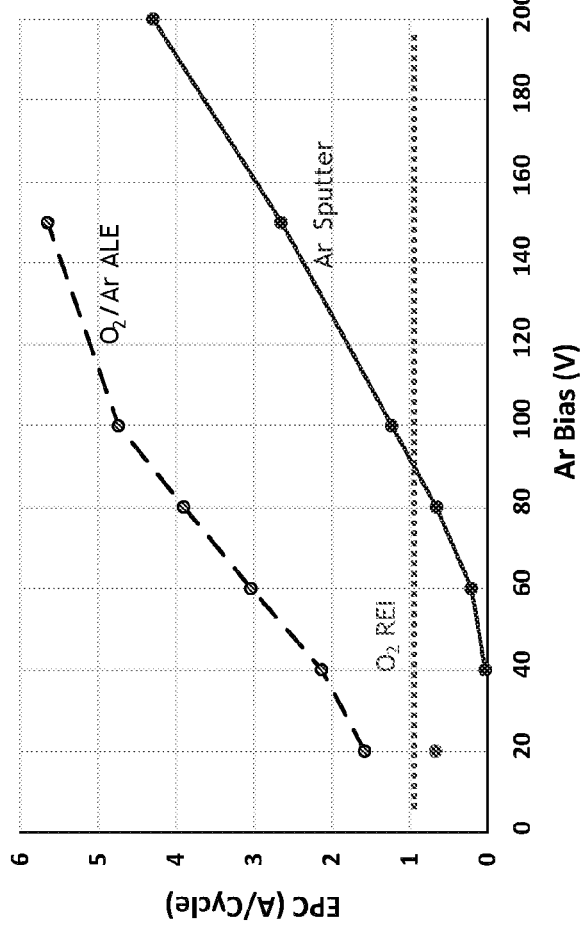
FIGS. 3A-B present data showing a comparison of the ALE results obtained for Ru smoothing in accordance with an embodiment of this disclosure compared to other etch processes and chemistries.
Figure 3B:
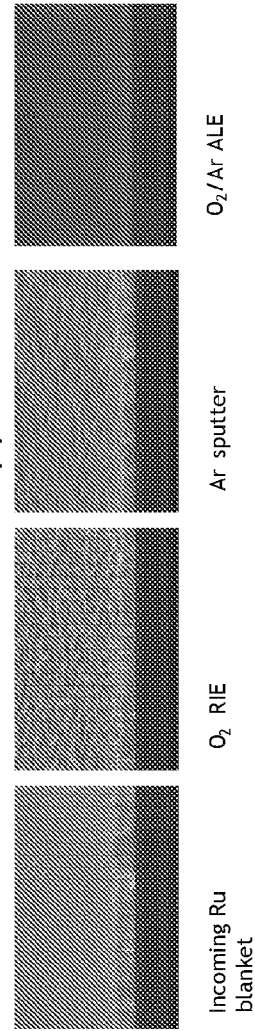

Additional data is presented in FIGS. 3A-B, showing a comparison of the ALE results obtained for Ru smoothing in accordance with this disclosure compared to other etch processes and chemistries. FIG. 3A shows a plot of etch per cycle (EPC) as a function of Ar bias for a Ru substrate for $O_2$/Ar ALE as described herein, compared to other etch processes and chemistries. FIG. 3B shows SEM plot of the corresponding substrate surfaces, incoming, $O_2$ reactive ion etch (RIE) alone, Ar sputtering alone, and $O_2$/Ar ALE. Both $O_2$ RIE and Ar sputtering alone resulted in rougher surfaces, while $O_2$/Ar ALE resulted in a much smoother surface.

While this disclosure is not limited by any particular theory of operation, it is believed this smoothening phenomenon may be due to high-synergy self-limiting ALE processes, and there could be multiple reasons why the smoothening is so extreme. In the ALE modification operation, a small radius of curvature has higher reactivity which could preferentially etch sharp corners; a corner can bond to 2 to 3 modification gas atoms instead of 0 to 1 on flat or concave surfaces. Furthermore, in the ALE removal operation inert ions in the absence of reactants can smooth surfaces by amorphization of the top ~1 nm of the surface, which promotes diffusion of surface atoms. In contrast, in RIE, diffusion is hindered by strong bonds of etch species (e.g., Cl) attached to the crystal structure of the material to be etched.

The resulting ultra-smooth a nanoscopic metal films would be expected to have decreased electrical resistivity due to less electron scattering at its surface, and might be able to be etched very thin while still keeping continuous to make a better barrier metal taking up less volume in a tiny 3D feature. In addition to the evident semiconductor processing applications, there may also be applications beyond the semiconductor industry.

Another example is Ta ALE in which an about 33% reduction in surface roughness has been achieved (1.04 to 0.7 nm RMS).

Figure 4:
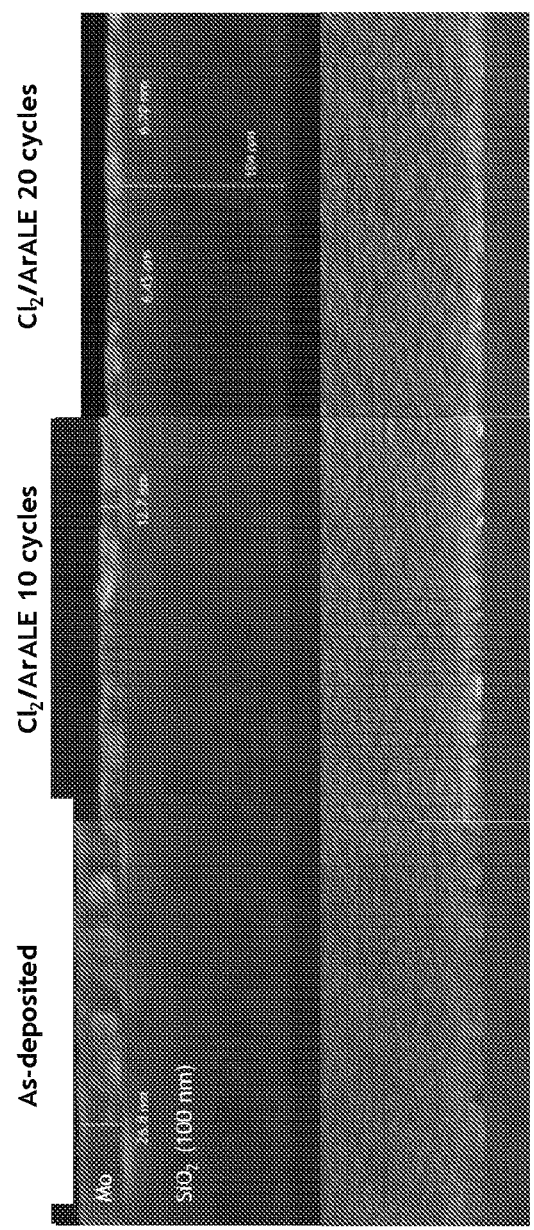
FIG. 4 depicts SEM images showing the high selectivity of an ALE process in accordance with an embodiment of this disclosure that has been demonstrated with Mo utilizing an $O_2/Cl_2$ modification chemistry.
Figure 5:
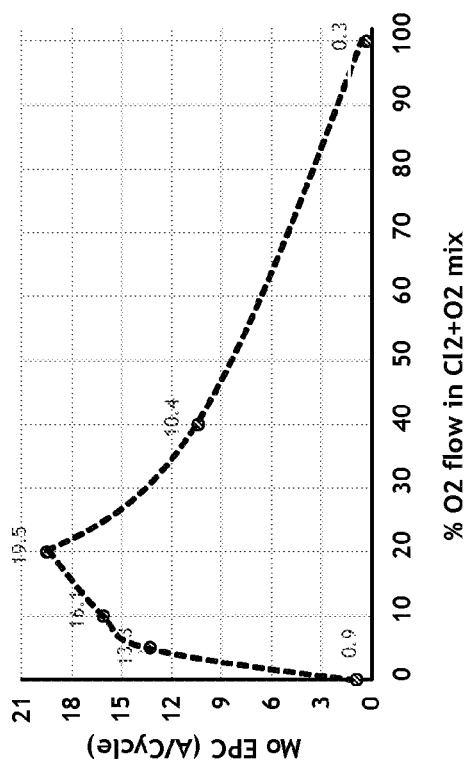
FIG. 5 shows a plot of data demonstrating that $Cl_2$ and $O_2$ modification mixture chemistries show 10-20 times faster etch rate of Mo blanket films compared to $Cl_2$ only or $O_2$-only modification chemistries in accordance with embodiments of this disclosure.

Still another example relates to smoothing via a ALE process that can also achieve high selectivity. Such a process has been demonstrated with Mo utilizing an $O_2/Cl_2$ modification chemistry, as described and depicted in FIGS. 4 and 5. FIG. 4 shows that a $Cl_2$/Ar ALE process maintains the initial Mo surface roughness prior to ALE. FIG. 5 shows that $Cl_2$ and $O_2$ modification mixture chemistries show 10-20 times faster etch rate of Mo blanket films compared to $Cl_2$ only or $O_2$ only modification chemistries. Also, a 10% $O_2$/90% $Cl_2$ modification chemistry provided a high degree (>400:1) of etch selectivity relative to $SiO_2$ dielectric (compared to just 10:1 for 100% $Cl_2$ modification chemistry).

Such processes may be extended to other refractory metals or to other high surface binding energy (high $E_O$) materials to, depending on the specific metal and process conditions, provide ultra-smoothening with high etch rate and/or high selectivity with respect to a mask material (e.g., an ashable amorphous carbon hard mask). The chemistry could be a suitably chosen admixture of oxidizing/chlorinating species. For example, a very high $O_2/Cl_2$ ratio or even 100% $O_2$ could be used for Ru; and a very low $O_2:Cl_2$ ratio could be used for Mo (e.g., 10% $O_2$/90% $Cl_2$).

Figure 6:
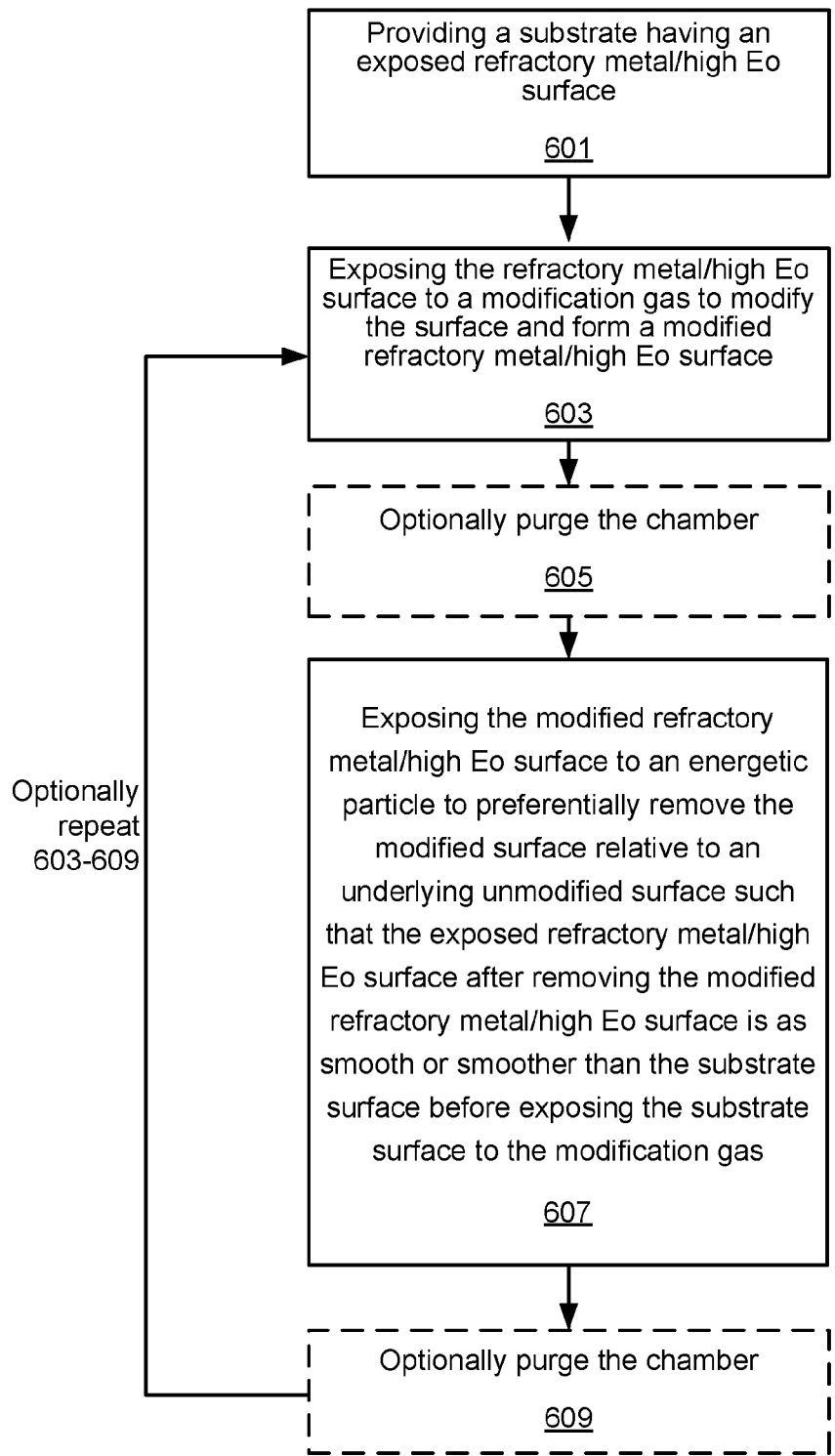
FIG. 6 depicts a flow chart of a method of etching a refractory metal or other high $E_O$ material on a substrate in accordance with embodiments this disclosure.

FIG. 6 shows a flow chart of a method of etching a refractory metal or other high $E_O$ material on a substrate in accordance with this disclosure. At 601 a substrate having an exposed refractory metal/high $E_O$ material surface is provided. At 603 the refractory metal/high $E_O$ surface is exposed to a modification gas to modify the surface and form a modified refractory metal surface. At 607 the modified refractory metal/high $E_O$ surface is exposed to an energetic particle to preferentially remove the modified refractory metal/high $E_O$ surface relative to an underlying unmodified refractory metal/high $E_O$ surface such that the exposed refractory metal/high $E_O$ surface after removing the modified refractory metal/high $E_O$ surface is as smooth or smoother than the substrate surface before exposing the substrate surface to the modification gas. The modification and removal operations may be followed by purging 605, 609 of the process chamber, and are generally repeated until the desired level of etch and/or smoothness is achieved.

Apparatus

Inductively coupled plasma (ICP) reactors which, in certain embodiments, may be suitable for atomic layer etching (ALE) operations are now described. Such ICP reactors have also described in U.S. Patent Application Publication No. 2014/0170853, filed Dec. 10, 2013, and titled "IMAGE REVERSAL WITH AHM GAP FILL FOR MULTIPLE PATTERNING," hereby incorporated by reference in its entirety and for all purposes. Although ICP reactors are described herein, in some embodiments, it should be understood that capacitively coupled plasma reactors may also be used.

Figure 7:
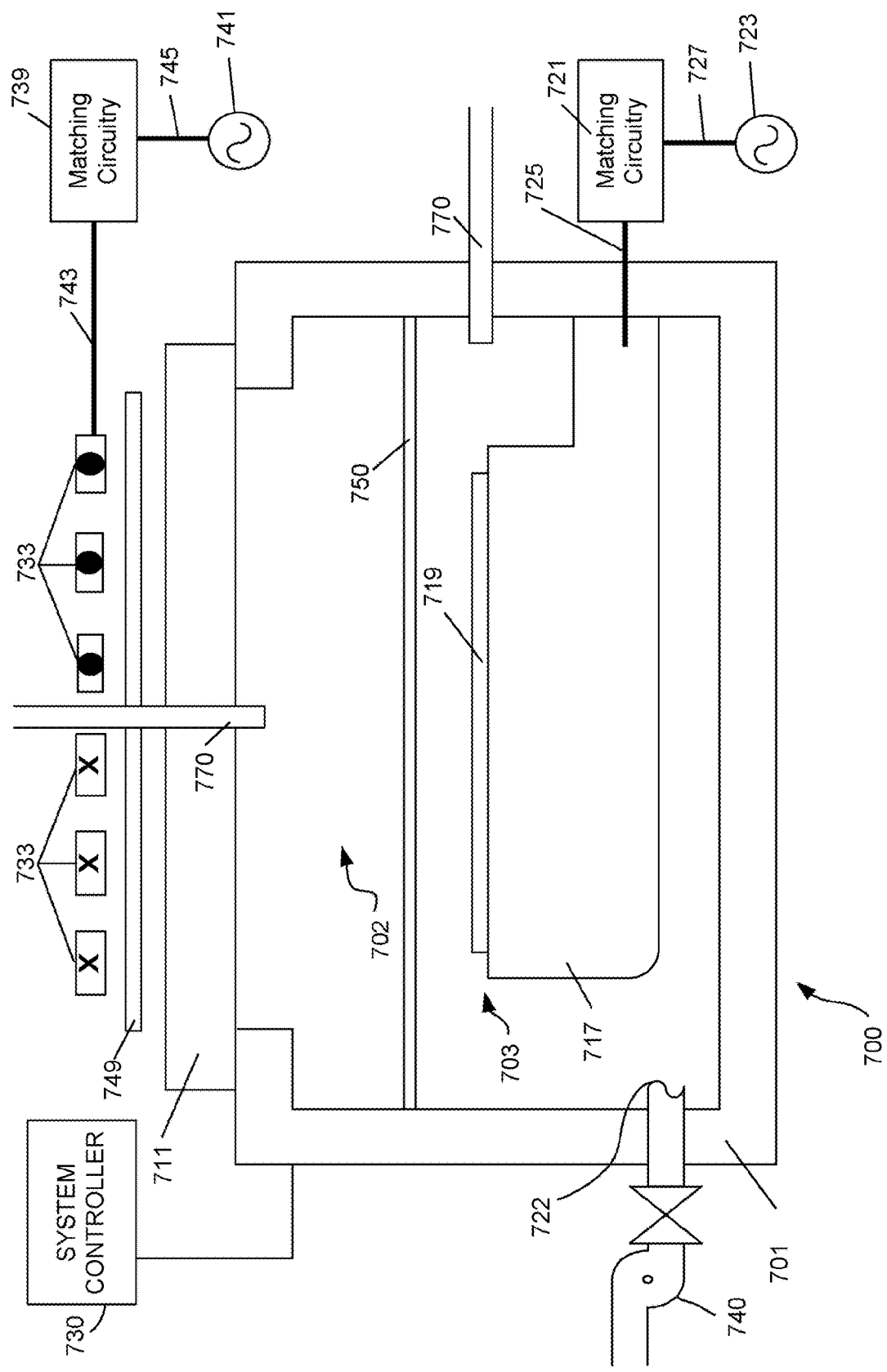
FIG. 7 schematically shows a cross-sectional view of an inductively coupled plasma etching apparatus appropriate for implementing certain embodiments herein.

FIG. 7 schematically shows a cross-sectional view of an inductively coupled plasma etching apparatus 700 appropriate for implementing certain embodiments herein, an example of which is a Kiyo™ reactor, produced by Lam Research Corp. of Fremont, Calif. The inductively coupled plasma apparatus 700 includes an overall process chamber 701 structurally defined by chamber walls 701 and a window 711. The chamber walls 701 may be fabricated from stainless steel or aluminum. The window 711 may be fabricated from quartz or other dielectric material. An optional internal plasma grid 750 divides the overall processing chamber 701 into an upper sub-chamber 702 and a lower sub-chamber 703. In most embodiments, plasma grid 750 may be removed, thereby utilizing a chamber space made of sub-chambers 702 and 703. A chuck 717 is positioned within the lower sub-chamber 703 near the bottom inner surface. The chuck 717 is configured to receive and hold a semiconductor wafer 719 upon which the etching and deposition processes are performed. The chuck 717 can be an electrostatic chuck for supporting the wafer 719 when present. In some embodiments, an edge ring (not shown) surrounds chuck 717, and has an upper surface that is approximately planar with a top surface of a wafer 719, when present over chuck 717. The chuck 717 also includes electrostatic electrodes for chucking and dechucking the wafer. A filter and DC clamp power supply (not shown) may be provided for this purpose. Other control systems for lifting the wafer 719 off the chuck 717 can also be provided. The chuck 717 can be electrically charged using an RF power supply 723. The RF power supply 723 is connected to matching circuitry 721 through a connection 727. The matching circuitry 721 is connected to the chuck 717 through a connection 725. In this manner, the RF power supply 723 is connected to the chuck 717.

Elements for plasma generation include a coil 733 is positioned above window 711. In some embodiments, a coil is not used in disclosed embodiments. The coil 733 is fabricated from an electrically conductive material and includes at least one complete turn. The example of a coil 733 shown in FIG. 7 includes three turns. The cross-sections of coil 733 are shown with symbols, and coils having an "X" extend rotationally into the page, while coils having a "•" extend rotationally out of the page. Elements for plasma generation also include an RF power supply 741 configured to supply RF power to the coil 733. In general, the RE power supply 741 is connected to matching circuitry 739 through a connection 745. The matching circuitry 739 is connected to the coil 733 through a connection 743. In this manner, the RF power supply 741 is connected to the coil 733. An optional Faraday shield 749 is positioned between the coil 733 and the window 711. The Faraday shield 749 is maintained in a spaced apart relationship relative to the coil 733. The Faraday shield 749 is disposed immediately above the window 711. The coil 733, the Faraday shield 749, and the window 711 are each configured to be substantially parallel to one another. The Faraday shield may prevent metal or other species from depositing on the dielectric window of the plasma chamber 701.

Process gases (e.g. chlorine, argon, oxygen, etc.) may be flowed into the processing chamber 701 through one or more main gas flow inlets 760 positioned in the upper chamber 702 and/or through one or more side gas flow inlets 770. Likewise, though not explicitly shown, similar gas flow inlets may be used to supply process gases to a capacitively coupled plasma processing chamber. A vacuum pump, e.g., a one or two stage mechanical dry pump and/or turbomolecular pump 740, may be used to draw process gases out of the process chamber 701 and to maintain a pressure within the process chamber 701. For example, the pump may be used to evacuate the chamber 701 during a purge operation of ALE. A valve-controlled conduit may be used to fluidically connect the vacuum pump to the processing chamber 701 so as to selectively control application of the vacuum environment provided by the vacuum pump. This may be done employing a closed-loop-controlled flow restriction device, such as a throttle valve (not shown) or a pendulum valve (not shown), during operational plasma processing. Likewise, a vacuum pump and valve controlled fluidic connection to the capacitively coupled plasma processing chamber may also be employed.

During operation of the apparatus, one or more process gases may be supplied through the gas flow inlets 760 and/or 770. In certain embodiments, process gas may be supplied only through the main gas flow inlet 760, or only through the side gas flow inlet 770. In some cases, the gas flow inlets shown in the figure may be replaced more complex gas flow inlets, one or more showerheads, for example. The Faraday shield 749 and/or optional grid 750 may include internal channels and holes that allow delivery of process gases to the chamber 701. Either or both of Faraday shield 749 and optional grid 750 may serve as a showerhead for delivery of process gases. In some embodiments, a liquid vaporization and delivery system may be situated upstream of the chamber 701, such that once a liquid reactant or precursor is vaporized, the vaporized reactant or precursor is introduced into the chamber 701 via a gas flow inlet 760 and/or 770. Example liquid precursors include $SiCl_4$ and silicon amides.

Radio frequency power is supplied from the RF power supply 741 to the coil 733 to cause an RF current to flow through the coil 733. The RF current flowing through the coil 733 generates an electromagnetic field about the coil 733. The electromagnetic field generates an inductive current within the upper sub-chamber 702. The physical and chemical interactions of various generated ions and radicals with the wafer 719 selectively etch features of and deposit layers on the wafer.

If the plasma grid is used such that there is both an upper sub-chamber 702 and a lower sub-chamber 703, the inductive current acts on the gas present in the upper sub-chamber 702 to generate an electron-ion plasma in the upper sub-chamber 702. The optional internal plasma grid 750 limits the amount of hot electrons in the lower sub-chamber 703. In some embodiments, the apparatus is designed and operated such that the plasma present in the lower sub-chamber 703 is an ion-ion plasma.

Both the upper electron-ion plasma and the lower ion-ion plasma may contain positive and negative ions, though the ion-ion plasma will have a greater ratio of negative ions to positive ions. Volatile etching and/or deposition byproducts may be removed from the lower sub-chamber 703 through port 722. The chuck 717 disclosed herein may operate at temperatures ranging between about −200° C. and about 600° C. or between about −20° C. and about 250° C. for processing a substrate to etch tantalum, the chuck 717 may be set at a temperature less than about 0° C. The temperature will depend on the process operation and specific recipe and the tool used.

Chamber 701 may be coupled to facilities (not shown) when installed in a clean room or a fabrication facility. Facilities include plumbing that provide processing gases, vacuum, temperature control, and environmental particle control. These facilities are coupled to chamber 701, when installed in the target fabrication facility. Additionally, chamber 701 may be coupled to a transfer chamber that allows robotics to transfer semiconductor wafers into and out of chamber 701 using typical automation.

In some embodiments, a system controller 730 (which may include one or more physical or logical controllers) controls some or all of the operations of a processing chamber. The system controller 730 may include one or more memory devices and one or more processors. In some embodiments, the apparatus includes a switching system for controlling flow rates and durations when disclosed embodiments are performed. In some embodiments, the apparatus may have a switching time of up to about 500 ms, or up to about 750 ms. Switching time may depend on the flow chemistry, recipe chosen, reactor architecture, and other factors.

In some implementations, a controller 730 is part of a system, which may be part of the above-described examples. Such systems can comprise semiconductor processing equipment, including a processing tool or tools, chamber or chambers, a platform or platforms for processing, and/or specific processing components (a wafer pedestal, a gas flow system, etc.). These systems may be integrated with electronics for controlling their operation before, during, and after processing of a semiconductor wafer or substrate. The electronics may be referred to as the "controller," which may control various components or subparts of the system or systems. The controller 730, depending on the processing parameters and/or the type of system, may be programmed to control any of the processes disclosed herein, including the delivery of processing gases, temperature settings (e.g., heating and/or cooling), pressure settings, vacuum settings, power settings, radio frequency (RF) generator settings, RF matching circuit settings, frequency settings, flow rate settings, fluid delivery settings, positional and operation settings, wafer transfers into and out of a tool and other transfer tools and/or load locks connected to or interfaced with a specific system.

Broadly speaking, the controller 730 may be defined as electronics having various integrated circuits, logic, memory, and/or software that receive instructions, issue instructions, control operation, enable cleaning operations, enable endpoint measurements, and the like. The integrated circuits may include chips in the form of firmware that store program instructions, digital signal processors (DSPs), chips defined as application specific integrated circuits (ASICs), and/or one or more microprocessors, or microcontrollers that execute program instructions (e.g., software). Program instructions may be instructions communicated to the controller in the form of various individual settings (or program files), defining operational parameters for carrying out a particular process on or for a semiconductor wafer or to a system. The operational parameters may, in some embodiments, be part of a recipe defined by process engineers to accomplish one or more processing steps during the fabrication of one or more layers, materials, metals, oxides, silicon, silicon dioxide, surfaces, circuits, and/or dies of a wafer.

The controller 730, in some implementations, may be a part of or coupled to a computer that is integrated with, coupled to the system, otherwise networked to the system, or a combination thereof. For example, the controller may be in the "cloud" or all or a part of a fab host computer system, which can allow for remote access of the wafer processing. The computer may enable remote access to the system to monitor current progress of fabrication operations, examine a history of past fabrication operations, examine trends or performance metrics from a plurality of fabrication operations, to change parameters of current processing, to set processing steps to follow a current processing, or to start a new process. In some examples, a remote computer (e.g. a server) can provide process recipes to a system over a network, which may include a local network or the Internet. The remote computer may include a user interface that enables entry or programming of parameters and/or settings, which are then communicated to the system from the remote computer. In some examples, the controller 730 receives instructions in the form of data, which specify parameters for each of the processing steps to be performed during one or more operations. It should be understood that the parameters may be specific to the type of process to be performed and the type of tool that the controller is configured to interface with or control. Thus as described above, the controller 730 may be distributed, such as by comprising one or more discrete controllers that are networked together and working towards a common purpose, such as the processes and controls described herein. An example of a distributed controller for such purposes would be one or more integrated circuits on a chamber in communication with one or more integrated circuits located remotely (such as at the platform level or as part of a remote computer) that combine to control a process on the chamber.

Without limitation, example systems may include a plasma etch chamber or module, a deposition chamber or module, a spin-rinse chamber or module, a metal plating chamber or module, a clean chamber or module, a bevel edge etch chamber or module, a physical vapor deposition (PVD) chamber or module, a chemical vapor deposition (CVD) chamber or module, an ALD chamber or module, an ALE chamber or module, an ion implantation chamber or module, a track chamber or module, and any other semiconductor processing systems that may be associated or used in the fabrication and/or manufacturing of semiconductor wafers.

As noted above, depending on the process step or steps to be performed by the tool, the controller might communicate with one or more of other tool circuits or modules, other tool components, cluster tools, other tool interfaces, adjacent tools, neighboring tools, tools located throughout a factory, a main computer, another controller, or tools used in material transport that bring containers of wafers to and from tool locations and/or load ports in a semiconductor manufacturing factory.

Figure 8:
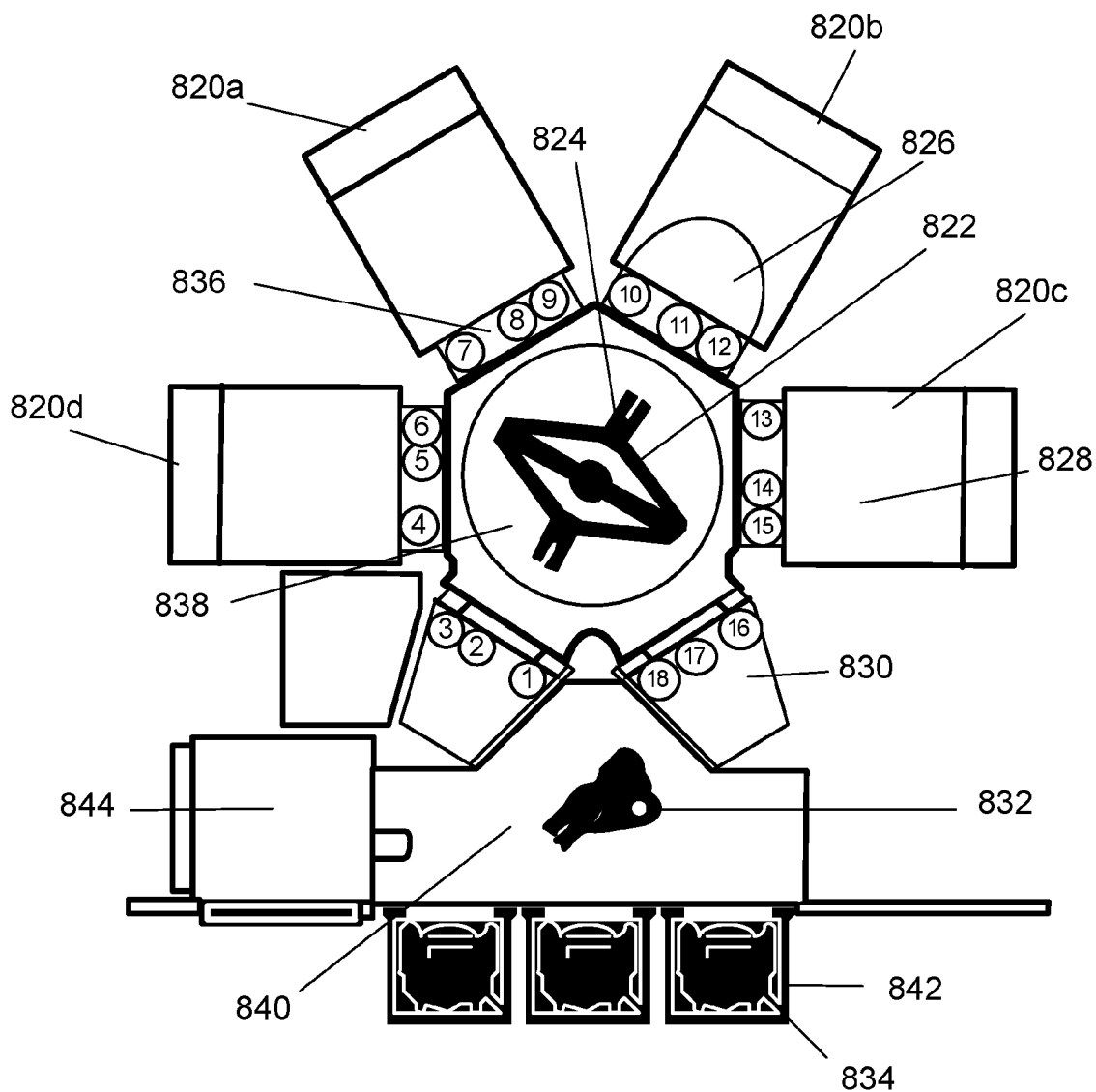
FIG. 8 depicts a semiconductor process cluster architecture with various modules that is appropriate for implementing certain embodiments herein.

FIG. 8 depicts a semiconductor process cluster architecture with various modules that interface with a vacuum transfer module 838 (VTM). The arrangement of transfer modules to "transfer" wafers among multiple storage facilities and processing modules may be referred to as a "cluster tool architecture" system. Airlock 830, also known as a loadlock or transfer module, is shown in VTM 838 with four processing modules 820a-820d, which may be individual optimized to perform various fabrication processes. By way of example, processing modules 820a-820d may be implemented to perform substrate etching, deposition, ion implantation, wafer cleaning, sputtering, and/or other semiconductor processes. One or more of the substrate etching processing modules (any of 820a-820d) may be implemented as disclosed herein, i.e., for introducing a modification gas, for introducing a removal gas, and other suitable functions in accordance with the disclosed embodiments. Airlock 830 and process module 820 may be referred to as "stations." Each station has a facet 836 that interfaces the station to VTM 838. Inside each facet, sensors 1-18 are used to detect the passing of wafer 826 when moved between respective stations.

Robot 822 transfers wafer 826 between stations. In one embodiment, robot 822 has one arm, and in another embodiment, robot 822 has two arms, where each arm has an end effector 824 to pick wafers such as wafer 826 for transport. Front-end robot 832, in atmospheric transfer module (ATM) 840, is used to transfer wafers 826 from cassette or Front Opening Unified Pod (FOUP) 834 in Load Port Module (LPM) 842 to airlock 830. Module center 828 inside process module 820 is one location for placing wafer 826. Aligner 844 in ATM 840 is used to align wafers.

In an exemplary processing method, a wafer is placed in one of the FOUPs 834 in the LPM 842. Front-end robot 832 transfers the wafer from the FOUP 834 to an aligner 844, which allows the wafer 826 to be properly centered before it is etched or processed. After being aligned, the wafer 826 is moved by the front-end robot 832 into an airlock 830. Because airlock modules have the ability to match the environment between an ATM and a VTM, the wafer 826 is able to move between the two pressure environments without being damaged. From the airlock module 830, the wafer 826 is moved by robot 822 through VTM 838 and into one of the process modules 820a-320d. In order to achieve this wafer movement, the robot 822 uses end effectors 824 on each of its arms. Once the wafer 826 has been processed, it is moved by robot 822 from the process modules 820a-820d to an airlock module 830. From here, the wafer 826 may be moved by the front-end robot 832 to one of the FOUPs 834 or to the aligner 844.

It should be noted that the computer controlling the wafer movement can be local to the cluster architecture, or can be located external to the cluster architecture in the manufacturing floor, or in a remote location and connected to the cluster architecture via a network. A controller as described above with respect to FIG. 7 may be implemented with the tool in FIG. 8.

CONCLUSION

Although the foregoing embodiments have been described in some detail for purposes of clarity of understanding, it will be apparent that certain changes and modifications may be practiced within the scope of this disclosure and the appended claims. It should be noted that there are many alternative ways of implementing the processes, systems, and apparatus of the present embodiments. Accordingly, the present embodiments are to be considered as illustrative and not restrictive, and the embodiments are not to be limited to the details given herein.

What is claimed:

1. A method of etching a refractory metal on a substrate, the method comprising:
    providing a substrate comprising an exposed refractory metal surface;
    exposing the exposed refractory metal surface to a modification gas to modify the exposed refractory metal surface and form a modified refractory metal surface; and
    exposing the modified refractory metal surface to an energetic particle to preferentially remove the modified refractory metal surface relative to an underlying unmodified refractory metal surface to leave an exposed unmodified refractory metal surface,
    wherein the exposed unmodified refractory metal surface after removing the modified refractory metal surface is as smooth or smoother than the exposed refractory metal surface before exposing the exposed refractory metal surface to the modification gas,
    wherein the refractory metal is selected from the group consisting of Mo, Ta, Ru, and oxides, carbides, nitrides, and sulfides thereof, and superconductors, and
    wherein the modification gas is selected from the group consisting of: oxygen-containing gas when the refractory metal comprises Ru, chlorine-containing gas when the refractory metal comprises Ta, and a mixture of about 10-20% oxygen-containing gas and about 80-90% chlorine-containing gas when the refractory metal comprises Mo.

2. The method of claim 1, wherein smoothness of the exposed unmodified refractory metal surface is maintained to be the same as smoothness of the exposed refractory metal surface.

3. The method of claim 1, wherein smoothness of the exposed unmodified refractory metal surface is greater than smoothness of the exposed refractory metal surface.

4. The method of claim 3, wherein the smoothness of the exposed unmodified refractory metal surface is greater by more than 10% RMS on the order of an order of magnitude increase in smoothness.

5. The method of claim 1, wherein the energetic particle is an inert ion plasma.

6. The method of claim 5, wherein the inert ion plasma is an Ar plasma.

7. The method of claim 1, wherein the substrate is used for non-semiconductor processing applications.

* * * * *